July 10, 1951 D. H. BLACK 2,559,587
AUTOMATIC GAIN CONTROL CIRCUIT
Filed May 20, 1947
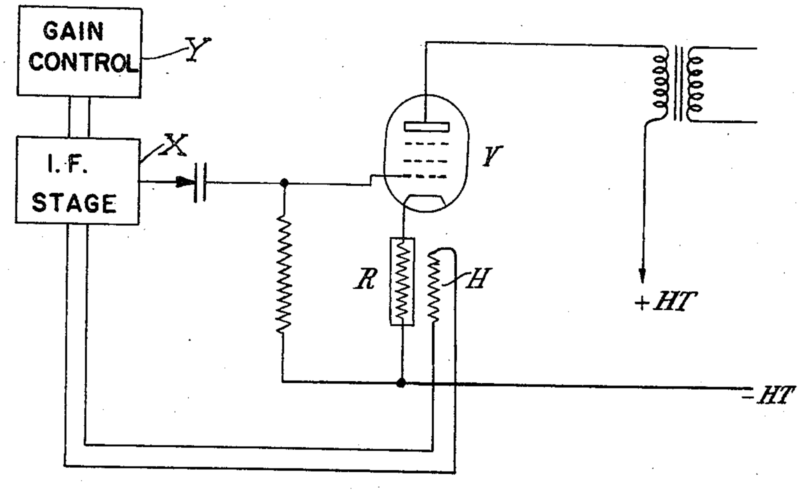
Inventor
Donald Harrison Black
By
[signature]
Attorney Patented July 10, 1951

2,559,587

UNITED STATES PATENT OFFICE 2,559,587

AUTOMATIC GAIN CONTROL CIRCUIT

Donald Harrison Black, London, England, assignor to International Standard Electric Corporation, New York, N. Y., a corporation of Delaware Application May 20, 1947, Serial No. 749,326
In Great Britain October 24, 1939

Section 1, Public Law 690, August 8, 1946
Patent expires October 24, 1959

2 Claims. (Cl. 179—171)

This invention relates to radio receivers and to automatic gain control arrangements therein.

In one aspect the invention resides in a radio receiver comprising an amplifier provided with gain-controlling negative feedback, the feedback path including a resistance having a substantial temperature coefficient of resistance and means for varying the temperature of said resistance in accordance with received signal intensity to vary the amount of feedback in a sense tending to maintain constant the output volume level of the receiver. The feedback resistance is preferably arranged in the cathode lead of the amplifier.

In another aspect a radio receiver comprises radio - frequency or intermediate - frequency amplifier stages subject to automatic gain control in known manner, and connections for passing the space current of one or more of said stages through a heater resistance associated with the temperature responsive feedback resistance of a low frequency amplifier.

The most general method in which automatic gain control or automatic volume control (A. V. C.) is effected is by means of one or more so-called variable-mu valves in the R. F. and the I. F. stages. The bias applied to the control grid of these valves is varied in accordance with the strength of the received carrier. In all except the most elaborate receivers, this bias voltage is obtained from the D. C. rectified current at the detector stage. Thus the signal applied to the detector which gives this controlling voltage is itself controlled, and consequently really constant volume becomes impossible.

Constant volume, independent of the strength of the received carrier, could however, be obtained if the controlling voltages could be applied to the output or low frequency stages of the receiver. The present invention comprises an improved way of doing this.

In the accompanying drawing a low frequency valve V, which may be the output valve, has a resistance R in the cathode lead. Since this resistance is not by-passed, it will introduce a measure of feedback into the circuit. The degree of feedback will depend upon the magnitude of R and the overall gain of the valve will depend upon the feedback. The resistance R is made of material which has a large negative temperature coefficient, and the temperature of the element is determined by the current flowing in an adjacent heater H. The preceding H. F. and I. F. stages X are subject to automatic gain control by Y in known manner and it is proposed to pass through the heater H the space currents of some or all of the controlled valves in the R. F. and I. F. stages. When the incoming signal is weak, the space currents in the R. F. and I. F. controlled valves are at a maximum and hence the temperature of R is at its highest value and its resistance at its lowest. The amount of feedback is at a minimum, and the gain of the L. F. stage at a maximum. When a strong signal is received the currents in the R. F. and I. F. valves will be decreased, the value of R will be increased and the gain of the L. F. stage reduced. By suitable choice of the necessary components, the output of the receiver could be made practically constant over a wide range of input signal.

A further advantage of the system is that since when strong signals are being received the feedback in the L. F. stage is at its highest, the distortion introduced in this stage is reduced and improved quality is obtained on strong stations.

The current through H due to space current from some or all of the pre-detector controlled valves may be augmented by a fixed current. Other means for obtaining a current through H which is dependent upon the strength of the incoming signal will be readily appreciated and it will also be seen that similar resistors may be used in subsequent L. F. stages if more than one of such stages are used.

In some circumstances it is arranged that the direct current through V is prevented from flowing through R. That is to say, the bias of V need not be dependent upon R.

Frequency correction can be obtained by connecting suitable networks across R. For instance, a condenser connected across R will by-pass the higher frequencies as R is increased, and consequently the gain for high frequencies is then greater than for low frequencies.

What is claimed is:

1. In a radio receiver comprising an amplifying stage, means for automatically controlling the gain of said stage an amplifier coupled to the output of said stage and provided with gain-controlling negative feedback, the feedback path including a resistance having a substantial negative temperature coefficient of resistance connected in series in the cathode lead of the amplifier and means for varying the temperature of said resistance in accordance with the gain of said stage to vary the amount of feedback in a sense tending to maintain constant the output volume level of the receiver.

2. An arrangement according to claim 1 wherein said stage comprises radio-frequency or intermediate-frequency amplifier stages subject to automatic gain control in known manner, said amplifier is a low frequency amplifier, and connections for passing the space current of one or more of said stages through a heater resistance associated with the temperature responsive feedback resistance of said low frequency amplifier.

DONALD HARRISON BLACK.

REFERENCES CITED

The following references are of record in the file of this patent:

UNITED STATES PATENTS

| Number | Name | Date |
|---|---|---|
| 2,151,821 | Wilson | Mar. 28, 1939 |
| 2,154,888 | Black | Apr. 18, 1939 |
| 2,182,329 | Wheeler | Dec. 5, 1939 |